United States Patent [19]

Schafer et al.

[11] Patent Number: 5,351,611
[45] Date of Patent: Oct. 4, 1994

[54] ASSEMBLY DEVICE FOR BINDING BUNCHED CABLES

[75] Inventors: Holger Schafer, Weil am Rheim; Lothar Escher, Bellingen; Martin Busch, Bamlach, all of Fed. Rep. of Germany

[73] Assignee: A. Raymond GmbH & Co. KG, Lorrach, Fed. Rep. of Germany

[21] Appl. No.: 46,307

[22] Filed: Apr. 15, 1993

[30] Foreign Application Priority Data

Apr. 16, 1992 [DE] Fed. Rep. of Germany ....... 4212789

[51] Int. Cl.⁵ .............................................. B65B 13/34
[52] U.S. Cl. ................... 100/30; 100/33 PB; 140/93.2; 140/123.6
[58] Field of Search ................... 100/29, 30, 32, 33 R, 100/33 PB; 24/16 PB; 140/93 A, 93.2, 93.4, 123.6

[56] References Cited

U.S. PATENT DOCUMENTS

| 3,489,076 | 1/1970 | Countryman | 100/30 X |
| 3,570,554 | 3/1971 | Kabel | 100/29 X |
| 3,633,633 | 1/1972 | Countryman | 100/33 PB X |
| 4,610,067 | 9/1986 | Hara | 140/93.2 X |
| 4,763,700 | 8/1988 | Hidaka et al. | 140/93.2 |
| 4,908,911 | 3/1990 | Bretti et al. | 24/16 PB |

FOREIGN PATENT DOCUMENTS 2414106 10/1974 Fed. Rep. of Germany ..... 140/93.2
3525351 1/1987 Fed. Rep. of Germany .

Primary Examiner—Stephen F. Gerrity
Attorney, Agent, or Firm—Finnegan, Henderson, Farabow, Garrett & Dunner

[57] ABSTRACT

An assembly device for binding bunched cables with a plastic fastener having a serrated tension band and a separate locking clasp including a housing for holding a wound roll of the tension band, an exit opening in one end of said housing through which the tension band can be fed, a first guide channel in the housing having an entrance end and an exit end and positioned for feeding the tension band from its roll to the exit opening and a second guide channel located in the housing above the first guide channel for feeding an endless chain of the locking clasps interconnected together by frangible webs to position the locking clasps one at a time in the exit opening so that the tension band can be passed out through the opening in the clasp. A cutting blade is mounted in the housing between a locking clasp positioned in the exit opening and the exit end of the first guide channel, the channel being pivotally mounted in the housing adjacent its entrance end so that the channel can be pressed down from the feeding position to bring the tension band down into engagement with the blade to serve the band after it has been firmly wrapped around a bunch of cables and engaged with the locking clasp and a spring for returning the first guide channel to the feeding position.

5 Claims, 3 Drawing Sheets

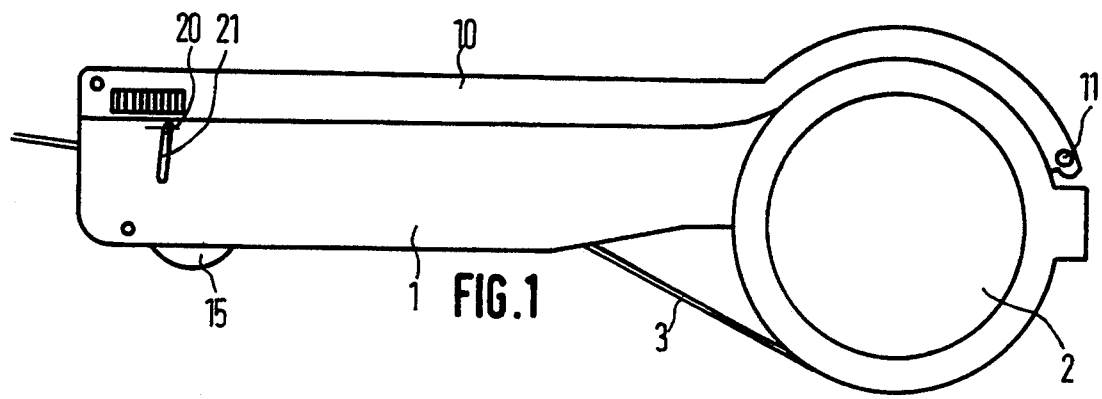
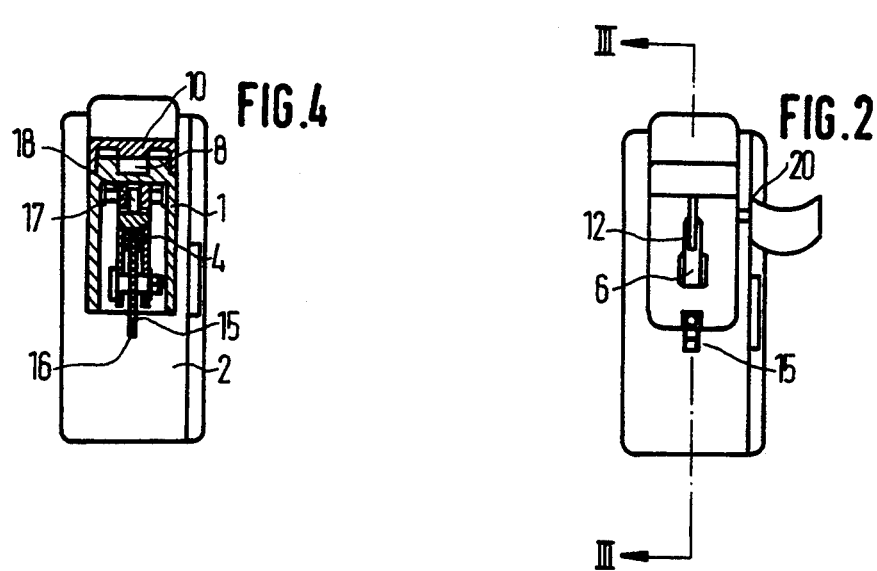
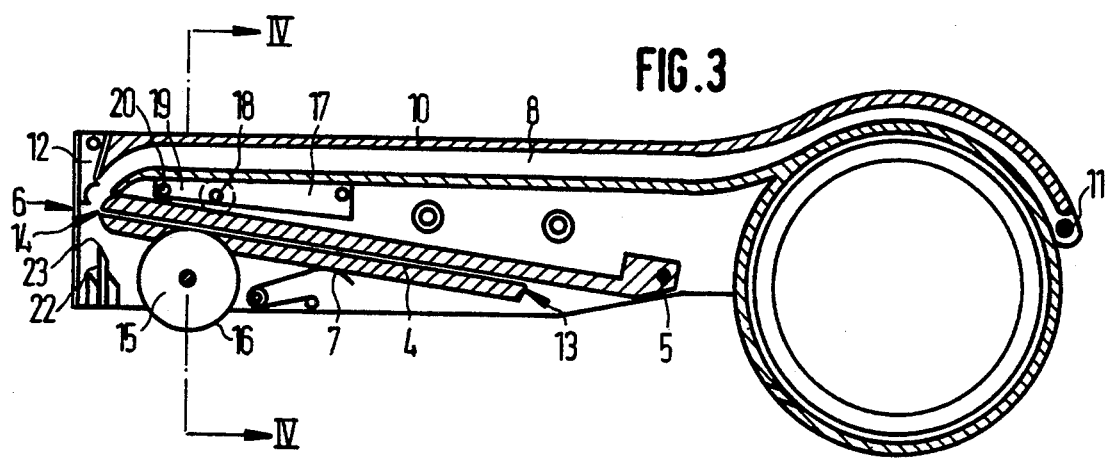

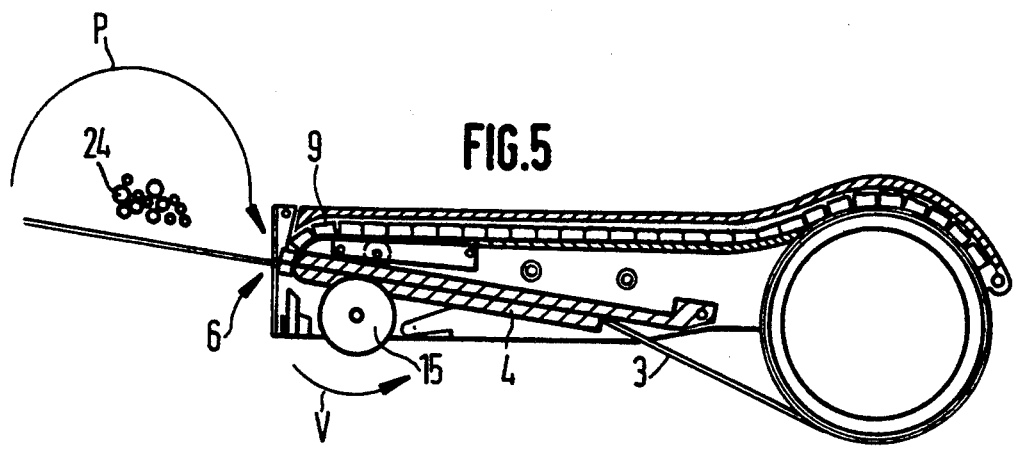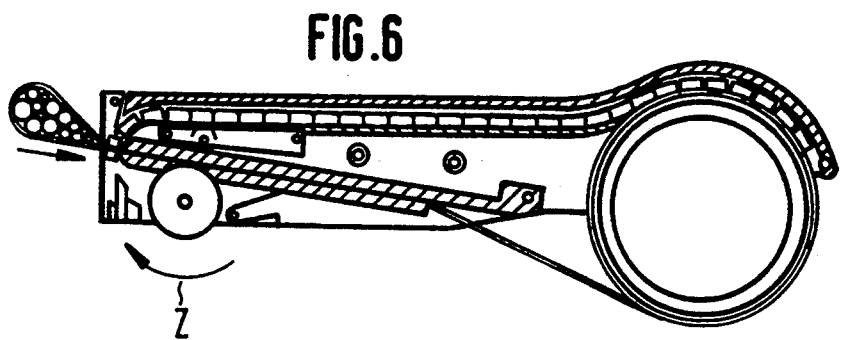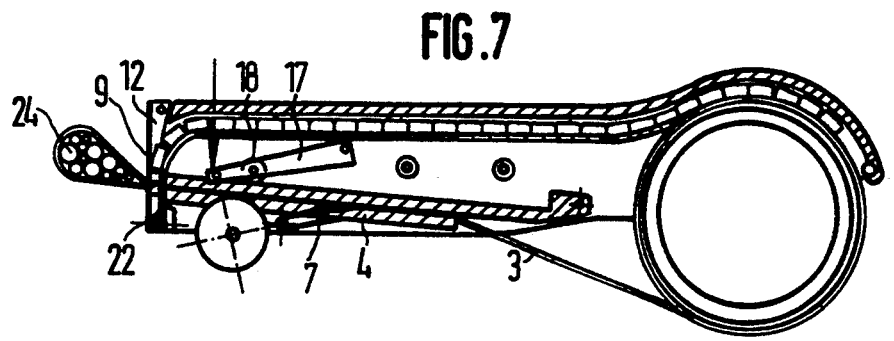

ASSEMBLY DEVICE FOR BINDING BUNCHED CABLES

BACKGROUND OF THE INVENTION

This invention relates to an assembly device for firmly binding bunched cables by means of a plastic fastener comprising a tension band of indeterminate length provided with transverse ribs or serrations and a locking clasp which interacts with the band and is made from a hard-flexible plastic material. Such a fastener is known from German Patent No. 35 25 351. The clasp has an opening in it through which the tension band is fed and two mutually opposite catching tongues, which interact with the transverse ribs or serrations on the band to lock it in place.

An assembly device for use with a fastener of this type is known from EP 0 303 723. This device essentially comprises a housing having a receiving part for holding a wound roll of the tension band, an opening for the exit and re-entry of the tension band, a guide channel for feeding the tension band to the opening, a further channel, arranged above the band guide channel, for feeding locking clasps to a position in front of the exit opening of the tension band, and a cutter, located behind the clasp, for severing the band ends projecting out of the locking clasp.

In this device, a disadvantage is that the locking clasps have to be magazined, i.e., stacked one on top of the other, on a special rod, and then pushed into the guide channel for the clasps so that they can be urged forward by means of spring(s) and transferred into a head part that is pivotally mounted to the housing in order to position a locking clasp in the proper place in front of the exit for the tension band.

Furthermore, the tension band has to be pushed by hand through its guide channel, and, after it is wrapped around the bunch of cables and its tip threaded into the clasp, it has to be pulled back again by hand before the tensioned band can be cut off by the cutter.

An object of the present invention therefore is to provide such an assembly device in which the locking clasps, connected to one another by frangible bonding webs so that they can be torn off one by one, can be inserted into the assembly device in the same form as they are produced in an injection-molding machine and advanced into a locking position and, furthermore, that transporting of the tension band through the housing is easier for the user.

SUMMARY OF THE INVENTION

To achieve this object, according to the present invention, the guide channel for the locking clasps in the assembly device of the invention leads the clasps around to the band exit opening in such a way that the clasps can be introduced into a holding position in front of the band exit and the guide channel for the tension band is pivotally mounted in the housing, so that the band can be pressed into the cutting region of the cutter.

More particularly, this invention provides an assembly device for firmly binding bunched cables with a plastic fastener, said fastener comprising a tension band of indeterminate length having transverse ribs along its length and adapted to be wrapped around said cables and a separate locking clasp having an opening for leading there through the tension band, said opening having two mutually opposite catching tongues that interact with the transverse ribs of the tension band to lock it in place, the assembly device comprising a housing for holding a wound roll of said tension band, an exit opening in one end of said housing through which said tension band can be fed, a first guide channel in said housing having an entrance end and an exit end and positioned for feeding the tension band from said roll to said exit opening, a second guide channel located in said housing above said first guide channel for feeding an endless chain of said locking clasps interconnected together by frangible webs to position the locking clasps one at a time in said exit opening so that the tension band can be passed out through the opening in a clasp and a cutting blade mounted in the housing between a locking clasp positioned in said exit opening and the exit end of said first guide channel, said first guide channel being pivotally mounted in said housing adjacent its entrance end so that the exit end of the first guide channel can be pressed down from the feeding position to bring said tension band down into engagement with said blade to sever said tension band after it has been firmly wrapped around a bunch of cables and engaged with said locking clasp and spring means for returning said first guide channel to the feeding position.

Handling of the device is facilitated by providing a knurled wheel actuated by the index finger of the same hand that holds the assembly device. Thus, the other hand remains free for wrapping the band around the bunch and for threading the end of the band back into the locking clasp.

BRIEF DESCRIPTION OF THE DRAWINGS

An illustrative embodiment of the invention is explained in more detail below and is shown in the drawings, in which:

FIG. 1 is a side elevation view of the assembly device of the invention;

FIG. 2 is a side view of the device, looking at the exit opening of the device;

FIG. 3 is a longitudinal cross-sectional view taken along the line III—III in FIG. 2;

FIG. 4 is a cross-sectional view taken along the line IV—IV in FIG. 3;

FIG. 5 is a longitudinal sectional view like FIG. 3 loaded with the tension band and locking clasps before the band is wrapped around the bunched cables;

FIG. 6 shows the assembly device as in FIG. 5 after wrapping the band around the bunched cables;

FIG. 7 shows the assembly device during cutting off of the tension band;

DETAILED DESCRIPTION OF THE INVENTION

Figure 8:
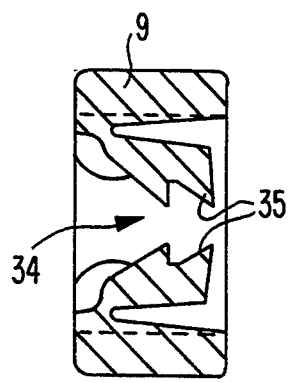
FIG. 8 is a sectional view of the locking clasp of a plastic fastener that can be used with the assembly device of the invention.
Figure 9:
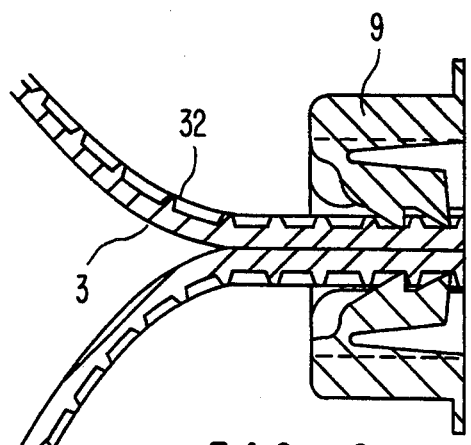
FIG. 9 is a sectional view showing the locking action between the tension band and the locking clasp of FIG. 8 following assembly.
Figure 10:
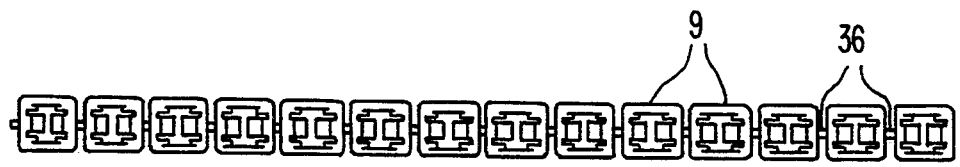
FIG. 10 shows the chain of frangibly interconnected locking clasps to be used with the assembly device.

The assembly device shown in the drawings serves to firmly bind bunched cables by means of a plastic fastener comprising an endless plastic tension band 3 together with a locking clasp 9 which is also made from a hard-flexible plastic material. The plastic fasteners are described in detail in German Patent No. 35 25 351 and their essential parts are shown in FIGS. 8–10. The tension bands 3 are provided with transverse ribs or serrations 32 and they are first fed through opening 34 in locking clasp 9 from the right side and, after being wrapped around the bunched cables, are inserted back through the same opening from the other side. In opening 34 there are two mutually opposite catching tongues 35, which can be opened by spring action and which interact with the transverse ribs of the two ends of tension band to hold it in place. See FIG. 9.

The assembly device comprises a housing 1 easily gripped with one hand having a receiving part 2 for holding a wound roll of tension band 3. As can be seen from FIG. 3, a first guide channel 4 is pivotally mounted inside of the housing at 5 in front of its entrance end 13 for guiding tension band 3 to its exit end 14 at a housing opening 6. Guide channel 4 is held in the feeding position shown by a spring means 7.

Arranged above first guide channel 4 is a second guide channel 8 for receiving the locking clasps 9 in the form of an endless chain. Channel 8 can be covered from above by a covering flute 10, which is pivotally connected to housing 1 at 11 and can be closed at the front end by any suitable engaging means, not shown in any more detail.

Located at the front end of covering flute 10 is a pivotally mounted catch 12, which is pressed by spring force against an upper perforated edge of a clasp 9 located in exit 6 of the housing and in front of the exit end 14 of guide channel 4. (See FIGS. 5 and 6) This catch ensures the accurate positioning of clasp 9 in front of the band channel during the leading through of the band and the engaging of the end of the band after it has been wrapped around the bunch of cables.

Channel 8 for the clasps 9 extends around in front of the exit end of guide channel 4 so that the clasps 9, which are connected to one another by frangible bonding webs 36 (see FIG. 10) so they can be readily torn apart, can be inserted with their opening directly into a holding position in exit 6 in front of the exit end 14 of guide channel 4.

Tension band 3 is moved forwards by means of a roller 15, which can be pressed against the band and turned by hand, and is knurled on its outer circumferential surface 16. Roller 15 is located underneath guide channel 4 just in front of band exit end 14 with part of its circumferential surface 16 projecting out of the housing, so that it can be turned easily by the index finger of the hand holding the assembly device.

A lever 17 is pivotally mounted in the housing 1 above pivotal guide channel 4. Lever 17 has in its front third a rotatably mounted roller 18, which rests on the upper forward part of guide channel 4. Lever 17 also extends somewhat beyond the roller and has at its forward end 19 a pin 20, which projects laterally out of the housing through arcuate slot 21 (FIG. 1) so that it can be pressed down by hand against the force of spring means 7 such as a leaf spring.

Located underneath band exit 14 in housing 1 is a cutting blade 22, which is directed with its cutting edge 23 toward the tension band. Upon downward pressing of pivotal guide channel 4 by pin 20, tension band 3 is pressed down against cutting edge 23 and cut off precisely between band exit 14 and locking clasp 9, which is also drawn down by the band 3. (See FIG. 7)

Operation of the assembly device is graphically illustrated in FIGS. 5 to 7.

In a first operating position, the assembly device, which is loaded with a tension band roll 3 and a string of clasps 9 joined together in the form of a chain, is positioned with its opening 6 in front of the bunch of cables 24.

By turning knurled roller 15 in the direction of arrow "V", tension band 3 is driven forwards out the exit end 14 of channel 4 and through the opening 34 in a clasp 9. Then, the free end of tension band 3 is led around bunch 24 in the direction of arrow "P" and threaded back again into the opening of the locking clasp 9 from the other side, until at least one transverse rib 32 on the band is engaged by a catching tongue 35 of the clasp.

The other end of band 3 is then pulled back tight against bunch 24 by turning roller 15 in the direction of arrow "Z", as can be seen in FIG. 6.

The binding operation is now complete. Guide channel 4 is then pressed downwards by lever 17 and pressure-applying roller 18 by pushing down on pin 20, so that the band end projecting rearwarding out of the clasp 9 meets cutting edge 23 of cutter 22 and is cut off (FIG. 7). Due to the simultaneous pressing down of clasp 9, the following clasp, connected to it by means of the bonding webs 36, will at the same time be drawn down into its operating position in housing opening 6 where it will be held by catch 12 in this position for the next binding operation.

What is claimed is:

1. An assembly device for firmly binding bunched cables with a plastic fastener, said fastener comprising a tension band of indeterminate length having transverse ribs along its length and adapted to be wrapped around said cables and a separate locking clasp having an opening for leading there through the tension band, said opening having two mutually opposite catching tongues that interact with the transverse ribs of the tension band to lock it in place, the assembly device comprising a housing for holding a wound roll of said tension band, an exit opening in one end of said housing through which said tension band can be fed, a first guide channel in said housing having an entrance end and an exit end and positioned for feeding the tension band from said roll to said exit opening, a second guide channel located in said housing above said first guide channel for feeding an endless chain of said locking clasps interconnected together by frangible webs to position the locking clasps one at a time in said exit opening so that the tension band can be passed out through the opening in the clasp, a cutting blade mounted in the housing between a locking clasp positioned in said exit opening and the exit end of said first guide channel, said first guide channel being pivotally mounted in said housing adjacent its entrance end so that the exit end of said first guide channel can be pressed down from the feeding position to bring said tension band down into engagement with said blade to sever said tension band after the band has been firmly wrapped around a bunch of cables and engaged with said locking clasp and spring means for returning said first guide channel to the feeding position.

2. The device of claim 1, including means for feeding the tension band through said first guide channel and through a locking clasp in said exit opening in the housing and for drawing the band back through said locking clasp after the band has been wrapped around the cables.

3. The device of claim 2, wherein said feeding means comprises a roller rotatably mounted in said housing so that it can be turned by hand and located adjacent to said exit opening, said roller having a knurled outer circumferential surface that interacts with the transverse ribs on the tension band while the band is in said first guide channel.

4. The assembly device of claim 1, including a catch pivotally mounted in the housing, for holding a clasp in the exit opening as the band is fed out and back through the clasp's opening.

5. The assembly device of claim 1, including a lever pivotally mounted at one end inside of said housing, a pin at the other end of the lever that projects out from one side of the housing and a roller rotatably mounted in the lever intermediate its ends for engagement with said first guide channel, whereby pressing down on said pin presses down said pivotally mounted first guide channel against the action of the spring means to cut the tension band.

* * * * *